US008226400B2

(12) United States Patent
Matsuoka et al.

(10) Patent No.: US 8,226,400 B2
(45) Date of Patent: Jul. 24, 2012

(54) DIE FOR MOLDING HONEYCOMB STRUCTURE AND MANUFACTURING METHOD THEREOF

(75) Inventors: Susumu Matsuoka, Nagoya (JP); Seiichi Inoue, Mie-gun (JP); Haremi Ito, Tokoname (JP); Keiji Matsumoto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 87 days.

(21) Appl. No.: 12/656,057

(22) Filed: Jan. 14, 2010

(65) Prior Publication Data
US 2010/0119640 A1 May 13, 2010

Related U.S. Application Data

(62) Division of application No. 10/481,751, filed as application No. PCT/JP02/11489 on Nov. 5, 2002, now Pat. No. 7,670,644.

(30) Foreign Application Priority Data

Nov. 5, 2001 (JP) .................................. 2001-338839

(51) Int. Cl.
*B29C 47/12* (2006.01)
(52) U.S. Cl. .................. 425/380; 264/177.12; 425/461; 425/467
(58) Field of Classification Search .................. 425/380, 425/461, 467; 264/177.12
See application file for complete search history.

(56) References Cited

U.S. PATENT DOCUMENTS

| 4,707,191 A | 11/1987 | Martinou et al. |
| 4,861,626 A | 8/1989 | Ihara et al. |
| 4,945,640 A | 8/1990 | Garg et al. |
| 4,980,201 A | 12/1990 | Tokunaga et al. |
| 5,070,588 A * | 12/1991 | Miwa et al. .................. 76/107.1 |
| 5,205,903 A | 4/1993 | Suzuki et al. |
| 6,193,497 B1 | 2/2001 | Suzuki |

(Continued)

FOREIGN PATENT DOCUMENTS

EP 0 276 083 A2 7/1988
(Continued)

OTHER PUBLICATIONS

Kirk-Othermer Encyclopedia of Chemical Technology, "Metal Surface Treatments, Pickling" pp. 1-3, Copyright 1995, published online Dec. 4, 2000.

*Primary Examiner* — Yogendra Gupta
*Assistant Examiner* — Joseph Leyson
(74) *Attorney, Agent, or Firm* — Oliff & Berridge, PLC

(57) ABSTRACT

A die for extrusion-forming a honeycomb structure which includes: a die base provided with ceramic puddle introducing holes and slits in communication with the ceramic puddle introducing holes; and a substrate layer, which roughly defines the final width of the slits, and a surface layer, which precisely defines the final width of the slits, formed on the die base in this order so that the final width of the slits becomes 15 to 200 μm, wherein the surface layer is made up of tungsten carbide particles which are 5 μm or less in average particle diameter and contain $W_3C$ as a main ingredient. According to this invention, there is provided a die for extrusion-forming a honeycomb structure which can restrain fluctuation in extrusion-forming speed among its parts and resistance to pushing force, both caused at the time of extrusion-forming, to be very small and is superior in productivity and durability.

3 Claims, 1 Drawing Sheet

U.S. PATENT DOCUMENTS

| | | |
|---|---|---|
| 6,315,545 B1 | 11/2001 | Inoue |
| 7,384,258 B2 * | 6/2008 | Kuwahara et al. ............ 425/380 |
| 2004/0076707 A1 * | 4/2004 | Matsumoto et al. .......... 425/461 |

FOREIGN PATENT DOCUMENTS

| | | |
|---|---|---|
| GB | 1542856 | 3/1979 |
| JP | A-60-106972 | 6/1985 |
| JP | A 60-145804 | 8/1985 |
| JP | B2 61-39167 | 9/1986 |
| JP | B2 62-15484 | 4/1987 |
| JP | A-63-109171 | 5/1988 |
| JP | A-63-199869 | 8/1988 |
| JP | A-2-191393 | 7/1990 |
| JP | A-10-309713 | 11/1998 |
| JP | A-2000-71226 | 3/2000 |
| JP | A-2000-169970 | 6/2000 |
| JP | A-2002-1716 | 1/2002 |

* cited by examiner

FIG.1(a)
FIG.1(b)
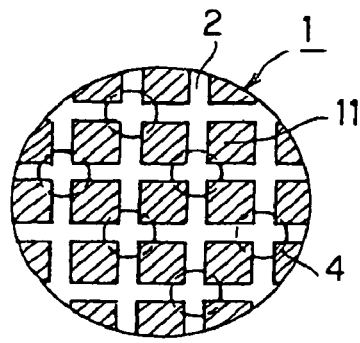
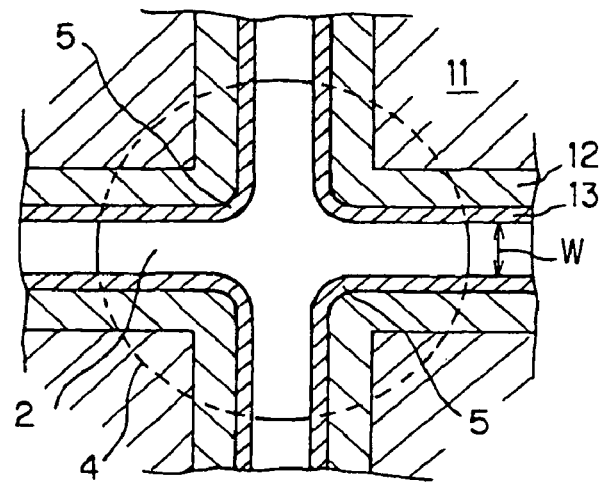
FIG.2
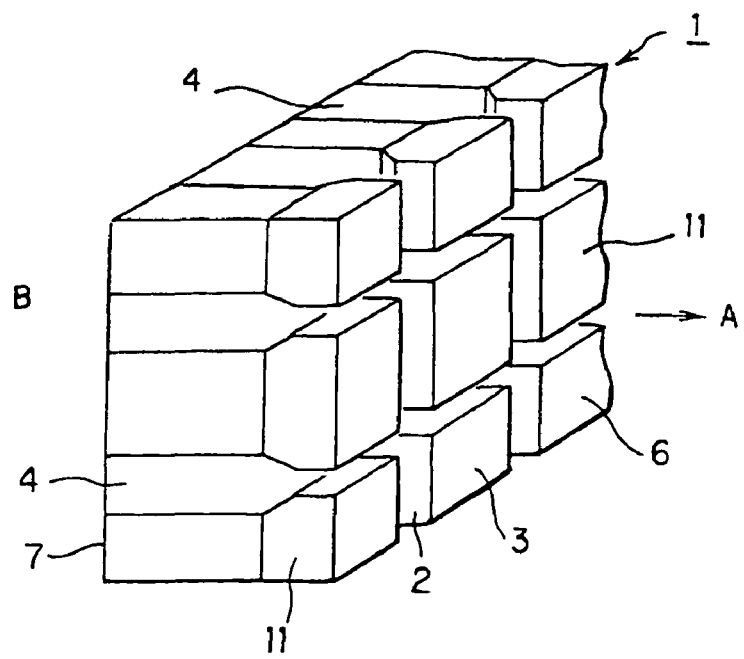

ular, by
DIE FOR MOLDING HONEYCOMB STRUCTURE AND MANUFACTURING METHOD THEREOF

This is a Division of application Ser. No. 10/481,751 filed on Dec. 23, 2003, now U.S. Pat. No. 7,670,644, which is a National Phase of Application No. PCT/JP02/11489 filed Nov. 5, 2002. Application No. PCT/JP02/11489 claims priority to Japan 2001-338839, filed on Nov. 5, 2001. The disclosures of the prior applications are hereby incorporated by reference in their entirety.

TECHNICAL FIELD

This invention relates to a die used when a honeycomb structure is extrusion-formed and a manufacturing method thereof and, in more particular, a die for extrusion-forming a honeycomb structure which includes: a die base; and a substrate layer and a surface layer which are formed on the die base so as to provide the die base with slits of a specified width and a manufacturing method thereof.

BACKGROUND ART

Conventionally, ceramic honeycomb structures have been widely used as, for example, a filter for purifying exhaust gases and a catalyst carrier, etc. In recent years, as the regulation of exhaust gas has been tightened, there have been increasing demands for a honeycomb structure, as a filter, whose partition walls are as thin as 120 µm or less so that it can achieve higher exhaust gas purifying performance. The partition walls of the honeycomb structure is expected to become thinner more and more in the future.

As a method for manufacturing such honeycomb structures, extrusion-forming has been generally used, and it is the width of the slits provided on their dies that determine the thickness of the partition walls of the honeycomb structures when manufacturing them by extrusion-forming. Thus, a variety of dies have been disclosed whose slits width is adjusted by forming coating layers on their bases.

Specifically, there is disclosed a die, as one example of conventional dies for forming honeycomb structures, whose slit width is adjusted by forming a coating layer on its base by electroless plating (JP-A-61-39167).

Further, there is disclosed another die for extrusion-forming a honeycomb structure whose resistance to abrasion is improved by forming, by chemical vapor deposition (CVD), a coating layer consisting of iron boride, chromium carbide, aluminum oxide, titanium carbide, titanium nitride, or titanium nitride carbide on it die base (JP-A-60-145804).

In the die for extrusion-forming a honeycomb structure described in the above patent document 1, the abrasion resistance of the coating layer is not necessarily sufficient to extrude ceramic materials, since the coating layer is formed by electroless nickel plating.

In the die disclosed in JP-A-60-145804, since the thickness of the coating layer formed by chemical vapor deposition (CVD) is up to about 30 µm, it is very difficult to provide slits of 120 µm or less wide, so long as the coating layer is formed by chemical vapor deposition on the die base where slits have been roughly provided by electrical discharge machining or grinding. Thus, even with this die, a honeycomb structure that complied with the recent demands could not be obtained.

In the meantime, there is disclosed in JP-A-2002-1716 a method for manufacturing a die for use in extrusion-forming of ceramic honeycomb structures which employs a die member provided with forming grooves and ceramic puddle feeding holes and includes a step of depositing a hardwearing material at least on the surface of the forming grooves by chemical vapor deposition, wherein the forming grooves of the die member are formed by grinding with a grinding stone, an electroless plating layer is formed at least on the surface of the forming grooves, and tungsten carbide as a hardwearing material is deposited on the electroless plating layer at 300° C. to 600° C.

Further, there is proposed in JP-A-10-309713 a die for use in extrusion-forming of a ceramic honeycomb structure whose base is provided with slits 30 to 200 µm wide, wherein the slit width is first roughly adjusted by forming a substrate layer on the base by electroless plating and then adjusted to be 30 to 200 µm by forming a surface layer consisting of $W_2C$ by chemical vapor deposition (CVD).

In these conventional manufacturing methods, however, what is disclosed is just to make up the surface layer of tungsten carbide or of a material containing $W_2C$ particles as a main ingredient, and they are not intended at all to make the surface layer or the hardwearing material provided on the die base a dense and uniform one.

Specifically, in the die obtained by the manufacturing method described in JP-A-2002-1716, since it is not manufactured taking into consideration the composition and particle diameter of the tungsten carbide which constitutes the hardwearing material, the speed of extrusion-forming ceramic puddle is apt to vary from part to part of the die at the time of extrusion-forming, whereby its formability is not necessarily satisfactory. Particularly when extrusion-forming a honeycomb structure whose partition wall thickness is 70 µm or less, poor forming is apt to occur, which has been a serious problem in meeting the demands for much thinner partition walls of honeycomb structures.

Further, in both the die obtained by the manufacturing method described in JP-A-2002-1716 and the die described in JP-A-10-309713, since the hardwearing material or the surface layer is made up of a material that contains a relatively large amount of $W_2C$, their surface roughness is large and their resistance to pushing force is relatively large at the time of extrusion-forming. Thus, with these dies, the extrusion-forming speed is low, and productivity of honeycomb structures leaves room for improvement. Furthermore, there arises another problem, due to large friction produced on the surface of the dies when ceramic puddle moving through their slits, of making the hardwearing material or the surface layer susceptible to abrasion.

DISCLOSURE OF THE INVENTION

This invention has been made in light of the above described problems which have been left unresolved by the prior art. And after focusing a great deal of effort on examining the problems, the present inventors have found that a surface layer which contains $W_3C$ of very small particle diameter as a main ingredient and has a uniform and small surface roughness can be selectively formed by restricting the conditions under which the surface layer is formed by chemical vapor deposition within a specified range, in particular, by restricting the atmospheric temperature and pressure within a specified range. Thus, the present invention have been completed.

That is, according to the present invention there is provided a die for extrusion-forming a honeycomb structure (hereinafter sometimes referred to simply as "die") which includes: a die base provided with ceramic puddle feeding holes and slits in communication with the ceramic puddle feeding holes; a substrate layer, which roughly defines the final width of the slits, and a surface layer, which precisely defines the final width of the slits, formed on the above die base in this order so that the final width of the slits becomes 15 to 200 μm, characterized in that the surface layer is made up of tungsten carbide particles which are 5 μm or less in average particle diameter and contain $W_3C$ as a main ingredient.

The term "main ingredient" herein used means an ingredient having the highest content among the ingredients constituting the surface layer.

Preferably the die of this invention includes a substrate layer of 10 to 100 μm thick and a surface layer of 1 to 30 μm thick formed on its base in this order. More preferably the surface layer of the die contains $W_3C$ particles of 5 μm or less in average diameter and 5 μm or less in maximum diameter as a main ingredient.

This invention can be preferably applied to a die whose slit width is 15 to 70 μm.

In the meantime, this invention provides a method for manufacturing a die for extrusion-forming a honeycomb structure, as a method suitably used for manufacturing the above described die, which includes the steps of: forming a substrate layer, by the processes including electroless plating, on the die base provided with ceramic puddle introducing holes and slits in communication with the ceramic puddle introducing holes; and forming a surface layer on the substrate layer by chemical vapor deposition (CVD) so as to provide slits of a specified width (e.g. of 10 to 200 μm width), characterized in that the formation of the surface layer by chemical vapor deposition (CVD) is carried out while feeding a reaction gas consisting of $WF_6$, $C_6H_6$ and $H_2$ to a reaction chamber at an atmospheric temperature of 310 to 420° C. and at an atmospheric pressure of 1 to 35 Torr.

The term "atmospheric pressure" herein used means pressure measured in the vicinity of one end of the die base where the reaction gas flows out.

Preferably a W/C molar ratio of the reaction gas in this invention is 0.6 to 6.

Preferably the formation of the surface layer by chemical vapor deposition (CVD) in this invention is carried out while varying the atmospheric temperature and pressure in the reaction chamber depending on the desired final width of the slits provided on the die. Specifically, when providing slits of 15 to 70 μm width, preferably the formation is carried out while feeding a reaction gas consisting of $WF_6$, $C_6H_6$ and $H_2$ to a reaction chamber at an atmospheric temperature of 310 to 380° C. and at an atmospheric pressure of 1 to 30 Torr. And particularly preferably the formation of the surface layer by chemical vapor deposition (CVD) is carried out at an atmospheric temperature of 340 to 360° C.

As described above, in this invention, the width of the slits relatively roughly formed on the die base is narrowed, by forming a substrate layer on the die base through the use of electroless plating that can provide a coating layer with a wide range of thickness, to such an extent that it can be adjusted to a desired final width by forming a surface layer on the substrate layer through the use of chemical vapor deposition (CVD).

This invention makes it possible to provide slits having width as extremely small as about 200 μm or less with a high accuracy by laminating the surface layer through the use of chemical vapor deposition (CVD) that can control the thickness of a coating layer at a level of 1 μm. Accordingly, with the die for extrusion-forming a honeycomb structure of this invention, a honeycomb structure whose partition walls are as thin as 200 μm or less, or as thin as 150 μm or less, or furthermore as thin as 70 μm or less can be manufactured with a high accuracy.

In addition, in the die of this invention, not only the problems of variation in extrusion-forming speed among the parts and increase in resistance to pushing force, which are usually caused at the time of extrusion-forming when using a die having slits of extremely small width as above, but also the problems of deterioration of abrasion resistance on the surface and decrease in productivity of a honeycomb structure, which accompany the above described problems, are solved by making up its surface layer of a specified material.

Specifically, in the die of this invention, its surface is allowed to be smooth and of uniform in the roughness by making up its surface layer of tungsten carbide particles which are 5 μm or less in average particle diameter, more preferably 5 μm or less in average particle diameter and 5 μm or less in maximum particle diameter, and contain $W_3C$ as a main ingredient. Thus, in the die of this invention, the flow of ceramic puddle is more smooth and uniform at every part, compared with the conventional dies, whereby extrusion-forming of a honeycomb structure can be performed in state where resistance to pushing force is low and fluctuation in extrusion-forming speed among the parts hardly occurs. Thus, according to the die of this invention, a honeycomb structure can be formed while completely avoiding poor forming, even when the partition walls of the object honeycomb structure are as thin as 70 μm or less. Further, according to the die of this invention, the extrusion-forming speed can be easily improved since the die can extrude ceramic puddle at lower pressures, resulting in improvement in productivity of a honeycomb structure. Still further, according to the die of this invention, since the friction created on the surface of the die and the pressure applied to the die when ceramic puddle moves through its slits are decreased, the durability of the surface layer is improved and the restrictions placed on the die in terms of its strength is reduced.

BRIEF DESCRIPTION OF THE DRAWINGS

FIG. 1(a) is a schematic cross-sectional view of a die for extrusion-forming a honeycomb structures in accordance with one embodiment of this invention and FIG. 1(b) is a partially enlarged view of FIG. 1(a); and FIG. 2 is a partially enlarged view of a die substrate of this invention schematically showing one example of slits and ceramic puddle introducing holes provided in the die substrate.

BEST MODE FOR CARRYING OUT THE INVENTION

The mode for carrying out this invention will now be described in detail with reference to the drawings.

As shown in FIGS. 1(a), 1(b) and 2, a die 1 of this invention includes: a die base 11 provided with ceramic puddle introducing holes 4 and slits 2 in communication with the ceramic puddle introducing holes 4; and a substrate layer 12, which roughly defines the final width of the slits, and a surface layer 13, which precisely defines the final width of the slits, formed on the die base 11 in this order so that the final width of the slit 2 becomes 15 to 200 μm, the die 1 being characterized in that the surface layer 13 is made up of tungsten carbide particles which are 5 μm or less in average particle diameter and contain $W_3C$ as a main ingredient.

In the die 1 thus constructed, both the fluctuation in extrusion-forming speed among its parts and resistance to pushing force, which are caused at the time of extrusion-forming, are extremely small and its productivity and durability are superior. In the following the die 1 will be described in detail in terms of its constituents.

As shown in FIG. 2, a die base 11 of this invention is usually provided with ceramic puddle introducing holes 4 formed on the surface 7 on the opposite side B to the formed product extruding side and provided with slits 2 formed, for example, in a grid arrangement on the surface 6 on the formed product extruding side A so that they communicate with the ceramic puddle introducing holes 4.

The ceramic puddle introducing holes 4 are usually provided so that they correspond to the positions where slits 2 intersect each other, and the ceramic puddle obtained by kneading ceramic raw materials etc. is introduced into the die 1 through the ceramic puddle introducing holes 4, and the formed product of a honeycomb structure is extruded through the slits 2.

As shown in FIG. 1, the die 1 of this invention includes a substrate layer 12, which roughly defines the final width of the slits, on its base 11.

The substrate layer 12 of this invention is formed with the object mainly of narrowing the width of the slits 2 having been roughly formed by machining etc. to such an extent that the slits can have a desired final width if a surface layer is provided on the substrate layer 12 by chemical vapor deposition (CVD) described later, and the thickness of the substrate layer 12 can be suitably selected from this viewpoint.

The substrate layer 12 may consist of a single layer or more than one layer. Accordingly, the thickness of the substrate layer 12 can also be controlled using the number of layers constituting the substrate layer.

However, the substrate layer 12 is usually provided to have thickness in the range of 10 to 100 µm, preferably in the range of 10 to 60 µm.

In the substrate layer 12 of this invention, its material is not particularly limited; however, preferably it is made up of a material which contains at least one selected from the group consisting of nickel, cobalt and copper, as a main ingredient, and particularly preferably which contains nickel as a main ingredient, because the substrate layer made up of such a material has a high joining strength to a surface layer, which is provided on the substrate layer and contains $W_3C$ as a main ingredient as described later.

The die 1 of this invention further includes a surface layer 13, which precisely defines the final width of the slits, on the substrate layer 12 described above, and the surface layer 13 is provided while controlling its thickness precisely at a level of 1 µm so that the thickness is in the range of 1 to 30 µm.

In this invention, such a surface layer is made up of tungsten carbide particles which are 5 µm or less in average particle diameter and contain $W_3C$ as a main ingredient.

However, the tungsten carbide particles constituting the surface layer of this invention may contain at least one selected from the group consisting of $W_2C$, WC and W as an ingredient other than $W_3C$. Further, the tungsten carbide particles may be crystalline, noncrystalline, or mixed crystalline particles.

Preferably the surface layer 13 of this invention contains as a main ingredient $W_3C$ particles 3.0 µm or less in average particle diameter, more preferably $W_3C$ particles 2.0 µm or less in average particle diameter, much more preferably $W_3C$ particles 0.5 µm or less in average particle diameter, much more preferably $W_3C$ particles 0.4 µm or less in average particle diameter, and particularly preferably $W_3C$ particles 0.1 µm or less in average particle diameter.

Making up the surface layer 13 mainly of $W_3C$ particles with such an average particle diameter permits the resistance to pushing force at the time of extrusion-forming to be decreased and the durability and productivity of the die to be improved.

Preferably the surface layer 13 of this invention contains as a main ingredient $W_3C$ particles 6.0 µm or less in maximum particle diameter, more preferably $W_3C$ particles 5.0 µm or less in maximum particle diameter, much more preferably $W_3C$ particles 1.0 µm or less in maximum particle diameter, and particularly preferably $W_3C$ particles 0.5 µm or less in maximum particle diameter.

If one uses $W_3C$ particles having the maximum particle diameter in such a range as a main ingredient, the fluctuation in extrusion-forming speed among the parts of the die may lessen further.

The surface layer 13 of this invention may consist of a single layer or more than one layer. Accordingly, the thickness of the surface layer 13 can be controlled using the number of layers constituting the surface layer; however, from the viewpoint of simplification of the manufacturing process, preferably the surface layer 13 consists of a single layer.

No restrictions other than those having been described so far are necessarily imposed on the die of this invention; however, in order to improve the strength of a honeycomb structure with thin partition walls, which is likely to be low due to the thin partition walls, preferably the corner portions 5 formed on the intersections of the slits 2 of the die 1 is rounded to be of R shape. The R shape is not particularly limited as long as it has a natural radius; however, preferably the R shape has a 15 to 80 µm radius of curvature.

Next, a method for manufacturing the die of this invention will be described.

In the method of this invention, first, ceramic puddle introducing holes and slits which communicate with the ceramic puddle introducing holes are made on a die base by machining such as ECM, EDM or grinding. In this step, the width W of the slits may be specified to be a little wider than a desired final width and in the precision range which can be accomplished by ECM, EDM or grinding. However, taking into consideration the layer thickness which electroless plating and chemical vapor deposition (CVD) can accomplish, preferably the width W is in the range of 150 to 300 µm. A specified number of slits can be provided in a desired arrangement, such as a grid arrangement, and in specified intervals, depending on the shape of the object honeycomb structure. Preferably the ceramic puddle introducing holes which communicate with the slits are made so that they open on the face of the die base opposite to the face in which the slits have been cut and are in the positions corresponding to the intersections of the slits.

Then, in the method of this invention, a substrate layer is formed on the above described die base by a process including electroless plating.

Preferably, the substrate layer of this invention is provided so that the slit width is narrowed to an extent that it can have a desired final width if a surface layer is formed on the substrate layer by chemical vapor deposition (CVD) described later. Usually the thickness of the substrate layer provided is 10 to 100 µm, preferably 10 to 60 µm, since it is also necessary to take into consideration the thickness which can be formed by a process including electroless plating. Forming the substrate layer by a process including electroless plating permits the corner portions of the die formed on the intersections of the slits to be of R shape having a natural radius.

Preferably the process including electroless plating of this invention is carried out while avoiding the formation of oxide layers as a mixture.

Specifically, the process including electroless plating carried out in this invention is (1) a process of forming a substrate layer at one continuous electroless plating, (2) a process of forming a substrate layer in an inert gas atmosphere by electroless plating, (3) a process of forming a substrate layer while measuring, in an electroless plating solution, the slit width obtained by forming the substrate layer on the die base, (4) a process of forming a substrate layer by electroless plating and then forming another substrate layer by electroplating on the formed substrate layer, or (5) a process of forming a substrate layer by electroless plating and then pickling the surface of the formed substrate layer with dilute nitric acid, acetic acid, etc. Each of these processes can be carried out alone or two or more can be carried out in combination.

When forming the substrate layer by the process (1), in order to easily control the thickness of the substrate layer, it is preferable to first prepare a plurality of dummies on which slits of the same width as those of the die base are formed and immerse them in the plating bath and then carry out the process while monitoring the slit width of the dummies.

When forming the substrate layer by the process (5), in order to ensure that oxide layers are not formed in the substrate layer, it is preferable to carry out the pickling operation in an inert gas atmosphere.

Preferably the substrate layer of this invention is made up of a material which contains at least one selected from the group consisting of nickel, cobalt and copper, as a main ingredient, and particularly preferably which contains nickel as a main ingredient, because the substrate layer made up of such a material has a high joining strength to a surface layer described later. Electroless plating can be carried out by conventional procedure. For example, it can be carried out by heating a plating solution containing the above metal and a reductant such as sodium hypochlorite or sodium borohydroxide to about 80 to 100° C. and immersing the die base in the plating solution for a specified time.

The corner portions of the intersections of the slits are allowed to be of R shape that has an arbitrary radius of curvature by changing the concentration of the electrolytic solution, the materials for plating, etc. when forming the substrate layer by electroless plating.

After forming the above described substrate layer, a surface layer is formed by chemical vapor deposition (CVD), which can precisely control the thickness of a layer to be formed and make the same uniform, so as to provide slits of 200 µM or less wide.

The reaction gas for use in chemical vapor deposition of this invention consists of $WF_6$, $C_6H_6$ and $H_2$. To form a surface layer which contains $W_3C$ at a high rate, preferably the W/C molar ratio is set for 0.6 to 6, more preferably 0.6 to 5, and particularly preferably 0.6 to 3.

In this invention, when carrying out chemical vapor deposition (CVD), the above reaction gas is introduced into a reaction chamber whose atmospheric temperature is set for 310 to 420° C. and atmospheric pressure for 1 to 35 Torr.

When the atmospheric temperature is higher than 420° C., even if the above reaction gas is used, a surface layer is formed which contains not only $W_3C$ particles, but also $W_2C$ particles of large particle diameter at a high rate and non-uniformly. As a result, the surface of the obtained die is rough and its surface roughness is non-uniform from part to part, which causes wide fluctuation in extrusion-forming speed among the parts of the die and high resistance to pushing force at the time of extrusion-forming. On the other hand, when the atmospheric temperature is lower than 310° C., a surface layer is formed which contains W particles at a high rate, which results in unsatisfactory adhesion to the substrate layer.

Thus, the surface layer is likely to peel off at the time of extrusion-forming, causing deterioration of the die's durability.

When the atmospheric pressure in the reaction chamber is higher than 35 Torr, the partial pressure of the reaction gas is increased and the reactivity is also increased, leading to formation of a surface layer which contains not only $W_3C$ particles, but also $W_2C$ particles of large particle diameter at a high rate and non-uniformly. As a result, the surface of the obtained die is rough and its surface roughness is non-uniform from part to part.

In this invention, preferably the above atmospheric temperature and pressure are selected depending on the final width of the die slits aimed at.

Specifically, when producing a die for extrusion-forming a honeycomb structure, the narrower the final width of the die slits becomes, the lower the flow rate of the reaction gas passing on the surface of the die base becomes; in such a situation, the reaction of the reaction gas having the above described concentration becomes easy to accelerate. And the formation of $W_2C$ particles is accelerated, a surface layer is easy to form which contains not only $W_3C$ particles, but also $W_2C$ particles at a high rate, which results in a surface layer having a non-uniform and high surface roughness. On the other hand, the wider the final width of the die slits becomes, the higher the flow rate of the reaction gas passing on the surface of the die base becomes; in such a situation, the reaction gas having the above described concentration becomes less reactive. And the film formation rate is lowered, causing decrease in productivity, while the formation of W particles is accelerated, resulting in decrease in adhesion to the substrate layer.

Accordingly, in this invention, in order to form a surface layer which contains $W_3C$ particles at a high rate, has a uniform and low surface roughness, and good adhesion to the substrate layer, it is preferable to select conditions under which the reaction gas is less reactive, that is, select an atmosphere of lower temperature or pressure as the final width of the die slits is decreased, whereas it is preferable to select conditions under which the reaction gas is more reactive, that is, select an atmosphere of higher temperature or pressure as the final width of the die slits is increased.

In more particular, for example, when the final slit width is set for more than 70 µm and 200 µm or less, preferably the atmospheric temperature of the reaction chamber is 320 to 400° C., more preferably 340 to 370° C., and particularly preferably 340 to 360° C.

Similarly, when the final slit width is set for more than 70 µm and 200 µm or less, the atmospheric pressure of the reaction chamber can be 1 to 35 Torr, preferably 1 to 30 Torr.

For example, when the final slit width is set for 15 to 70 µm, preferably the atmospheric temperature of the reaction chamber is 310 to 380° C., more preferably 330 to 370° C., and particularly preferably 340 to 360° C.

Similarly, when the final slit width is set for 15 to 70 µm, the atmospheric pressure of the reaction chamber is preferably 1 to 30 Torr, more preferably 1 to 20 Torr, still more preferably 1 to 15 Torr, and particularly preferably 1 to 10 Torr.

In the die of this invention, the total thickness of the substrate layer and the surface layer is not particularly limited, and suitable thickness can be appropriately selected depending on the width of the slits formed by machining such as EDM or grinding at the beginning.

However, to permit the above described corner portions of the die to be of R shape having a radius suitable for improving the strength of the honeycomb structure to be produced, and to use as few processes as possible for forming coating layers having desired properties so that production costs are reduced, preferably the total thickness of the substrate layer and the surface layer is 20 to 70 μm. The R shape can be maintained by providing a surface layer of uniform thickness on a substrate layer by chemical vapor deposition (CVD).

In the following this invention will be described in detail in terms of its practical examples; however, it should be understood that these examples are not intended to limit this invention.

EXAMPLE 1

First, a plate material consisting of SUS was machined on a lathe and a grinding wheel to be a square plate 250 mm×250 mm×20 mm (length×breadth×thickness). Then, slits 180 μm wide and 3.0 mm deep were cut at 1.0 mm intervals in one end face of the square plate by EDM and grinding. And another slits were cut in the same manner as above so that they were at right angles to the above cut slits. In the meantime, ceramic puddle introducing holes 1.00 mm in diameter and 18 mm deep were made at 1.0 mm intervals in the other end face of the square plate by ECM in such a manner as to position their central axes at the intersections (every other intersection) of the above cut slits so that they were in communication with the slits.

Then, the square plate thus obtained was machined into a disk 200 mm in outside diameter by EDM, degreased, and immersed in a 35% hydrochloric acid bath for one minute to be pre-treated. After that, the disk was plated in a nickel phosphate bath at one continuous electroless plating operation so as to form a substrate layer 40 μm thick on its surface. In the mean time, a plurality of dummies consisting of the same material as the die base were prepared and subjected to plating by electroless plating in the same manner as above. In the course of the plating operation, the dummies were taken out one by one with the lapse of time so as to monitor the thickness of their substrate layers.

Then, the disk with a substrate layer formed on its surface was allowed to stand still in a reaction chamber at an atmospheric temperature of 350° C. and an atmospheric pressure of 10 Torr, subjected to chemical vapor deposition (CVD) while feeding a reaction gas consisting of $WF_6$, $C_6H_6$ and $H_2$ (W/C molar ratio: 0.8) to the reaction chamber to form a surface layer 15 μm thick, and fitted in a given frame to give a die.

The die for extrusion-forming a honeycomb structure thus obtained was such that its slit width W was about 70 μm (180−(40+15)×2) and the corner portions formed on the intersections of its slits in a grid arrangement were of R shape with a radius of curvature of about 35 μm.

EXAMPLE 2 AND COMPARATIVE EXAMPLES 1, 2

Dies for use in forming of honeycomb structures were obtained in the same manner as in example 1 except that the disks with a substrate layer formed on their surfaces were allowed to stand still in reaction chambers at atmospheric temperatures of 330° C., 400° C. and 300° C. and an atmospheric pressure of 10 Torr, respectively, so that they were subjected to chemical vapor deposition (CVD).

The dies for use in extrusion-forming of honeycomb structures thus obtained were such that the width W of their slits was about 70 μm and the corner portions formed on the intersections of their slits in a grid arrangement were of R shape with a radius of curvature of about 35 μm.

(Evaluation)

In the die of example 1 having been subjected to chemical vapor deposition (CVD) at an atmospheric temperature of 350° C., its surface was uniformly lustrous. And the observation under an electron microscope revealed that the surface was made up of particles 0.5 μm or less in diameter and 0.1 μm in average diameter and had a uniform surface roughness. When analyzing the material of its surface layer using X-ray diffraction, the spectra obtained were mostly those of $W_3C$. And when using the die in extrusion-forming of the ceramic puddle containing a cordierite raw material as a main ingredient, a honeycomb structure with partition walls of 70 μm thick was obtained without causing poor forming.

In contrast with this, in the die of example 2 having been subjected to chemical vapor deposition (CVD) at an atmospheric temperature of 330° C., its surface was less lustrous than that of example 1. And the observation under an electron microscope revealed that the whole surface was made up of particles 1.0 μm or less in diameter and 0.5 μm in average diameter and the particles of each diameter had a little non-uniform distribution. When analyzing the material of its surface layer using X-ray diffraction, though the spectra obtained were mostly those of $W_3C$, there were mixed peaks of W component spectra at a high rate compared with that of the die of example 1. And when using the die in extrusion-forming of the ceramic puddle containing a cordierite raw material as a main ingredient, though a honeycomb structure with partition walls of 70 μm thick was obtained without causing poor forming, the resistance pressure at the time of extrusion-forming was increased compared with that of the die of example 1.

In the die of comparative example 1 having been subjected to chemical vapor deposition (CVD) at an atmospheric temperature of 400° C., its surface was lusterless. And the observation under an electron microscope revealed that the whole surface was made up of particles 2 to 6 μm in diameter (3 μm in average diameter) and the particles of each diameter had a non-uniform distribution. When analyzing the material of its surface layer using X-ray diffraction, the spectra obtained were mostly those of $W_2C$. And when using the die in extrusion-forming of the ceramic puddle containing a cordierite raw material as a main ingredient so as to produce a honeycomb structure, the extrusion-forming speed varied widely from part to part of the die, as a result, no honeycomb structure was produced. The resistance pressure at the time of extrusion-forming was increased compared with that of the die of example 2.

In the die of comparative example 2 having been subjected to chemical vapor deposition (CVD) at an atmospheric temperature of 300° C., its surface was considerably poor in luster. And the observation of the surface and the cross section of the die under an electron microscope revealed that the surface was made up of particles 3 μm or less in diameter and 2 μm in average diameter and part of the surface layer peeled off the substrate layer. When analyzing the material of its surface layer using X-ray diffraction, the spectra obtained were mostly those of W. And when using the die in extrusion-forming of the ceramic puddle containing a cordierite raw material as a main ingredient so as to produce a honeycomb structure, the surface layer of the die peeled off in a short period of time. The results are summarized in Table 1.

TABLE 1

|  | Atmospheric Temperature (° C.) | Material of Surface layer | Surface Roughness of Die Surface | Resistance Pressure | Formability | Peeling Properties | Average Particle Diameter (μm) | Maximum Particle Diameter (μm) |
|---|---|---|---|---|---|---|---|---|
| Comparative Example 1 | 400 | $W_2C$ mixed at a high rate | high, non-uniform | large | poor | not peeled | 3.0 | 6.0 |
| Example 1 | 350 | $W_3C$ present at a high rate | low, uniform | small | satisfactory | not peeled | 0.1 | 0.5 |
| Example 2 | 330 | W mixed at a low rate | a little high, a little non-uniform | a little large | satisfactory | not peeled | 0.5 | 1.0 |
| Comparative Example 2 | 300 | W mixed at a high rate | a little high, non-uniform | — | — | peeled | 2.0 | 3.0 |

*Table 1 shows the results obtained when setting the atmospheric pressure for 10 Torr and the final slit width for 70 μm.

EXAMPLE 3

First, a plate material consisting of SUS was machined on a lathe and a grinding wheel to be a square plate 250 mm×250 mm×20 mm (length×breadth×thickness). Then, slits 180 μm wide and 3.0 mm deep were cut at 1.5 mm intervals in one end face of the square plate by EDM and grinding. And another slits were cut in the same manner as above so that they were at right angles to the above cut slits. In the meantime, ceramic puddle introducing holes 1.40 mm in diameter and 18 mm deep were made at 1.5 mm intervals in the other end face of the square plate by ECM in such a manner as to position their central axes at the intersections (every other intersection) of the above cut slits so that they were in communication with the slits.

Then, the square plate thus obtained was machined into a disk 200 mm in outside diameter by EDM, degreased, and immersed in a 35% hydrochloric acid bath for one minute to be pre-treated. After that, the disk was plated in a nickel phosphate bath at one continuous plating operation by electroless plating so as to form a substrate layer 25 μm thick on its surface. In the mean time, a plurality of dummies consisting of the same material as the die base were prepared and subjected to plating by electroless plating in the same manner as above. In the course of the plating operation, the dummies were taken out one by one with the lapse of time so as to monitor the thickness of their substrate layers.

Then, the disk with a substrate layer formed on its surface was allowed to stand still in a reaction chamber at an atmospheric temperature of 350° C. and an atmospheric pressure of 10 Torr, subjected to chemical vapor deposition (CVD) while feeding a reaction gas consisting of $WF_6$, $C_6H_6$ and $H_2$ (W/C molar ratio: 0.8) to the reaction chamber to form a surface layer 15 μm thick, and fitted in a given frame to give a die.

The die for extrusion-forming a honeycomb structure thus obtained was such that its average slit width W was 100 μm (180−(25+15)×2) and the corner portions formed on the intersections of its slits in a grid arrangement were of R shape with a radius of curvature of about 25 μm.

EXAMPLES 4, 5 AND COMPARATIVE EXAMPLES 3, 4

Dies for use in extrusion-forming of honeycomb structures were obtained in the same manner as in example 3 except that the disks with a substrate layer formed on their surfaces were allowed to stand still in reaction chambers at atmospheric temperatures of 400° C., 330° C., 300° C. and 450° C. and an atmospheric pressure of 10 Torr, respectively, so that they were subjected to chemical vapor deposition (CVD) to form a surface layer 15 μm thick on the substrate layer.

The dies thus obtained were such that the width of their slits was about 100 μm and the corner portions formed on the intersections of their slits in a grid arrangement were of R shape with a radius of curvature of about 25 μm.

(Evaluation)

The results obtained from examples 3, 4 and comparative examples 3, 4 had basically the same tendency as those of examples 1, 2 and comparative examples 1, 2 where the final slit width was set for 70 μm; however, in the die of examples 3, 4 and comparative examples 3.4, it was observed that the suitable atmospheric temperature range of chemical vapor deposition (CVD) was shifted toward the higher temperature range because their final slit width was set for 100 μm. In the following the evaluation results will be described for each example and comparative example.

In the die of example 3 having been subjected to chemical vapor deposition (CVD) at an atmospheric temperature of 350° C., its surface was uniformly lustrous. And the observation under an electron microscope revealed that the surface was made up of particles 0.5 μm or less in diameter and 0.1 μm in average diameter and had a uniform surface roughness. When analyzing the material of its surface layer using X-ray diffraction, the spectra obtained were mostly those of $W_3C$.

When using the die in extrusion-forming of the ceramic puddle containing a cordierite raw material as a main ingredient and drying and firing the obtained formed product, a honeycomb structure with partition walls of 100 μm thick was obtained without causing poor forming.

In contrast with this, in the die of example 4 having been subjected to chemical vapor deposition (CVD) at an atmospheric temperature of 400° C., its surface was less lustrous than that of example 3. And the observation under an electron microscope revealed that the whole surface was made up of particles 5 μm or less in diameter and 2 μm in average diameter and the particles of each diameter had a little non-uniform distribution. When analyzing the material of its surface layer using X-ray diffraction, though the spectra obtained were mostly those of $W_3C$, there were mixed spectra of $W_2C$ at a high rate compared with that of the die of example 3.

When using the die in extrusion-forming of the ceramic puddle containing a cordierite raw material as a main ingredient and drying and firing the obtained formed product, though a honeycomb structure with partition walls of about 100 μm thick was obtained without causing poor forming, the resistance pressure at the time of extrusion-forming was a little increased compared with that of the die of example 3.

In the die of comparative example 3 having been subjected to chemical vapor deposition (CVD) at an atmospheric temperature of 450° C., its surface was lusterless. And the observation under an electron microscope revealed that the whole surface was made up of particles 3 to 10 μm in diameter (4 μm in average diameter) and the particles of each diameter had a non-uniform distribution. Further the thickness of the surface layer at the portions where slits were cut was non-uniform from the inside of the slits to the openings of the same and the difference in thickness observed was as large as 20 times. When analyzing the material of its surface layer using X-ray diffraction, the spectra obtained were mostly those of $W_2C$. And when using the die in extrusion-forming of the ceramic puddle containing a cordierite raw material as a main ingredient so as to produce a honeycomb structure, the extrusion-forming speed varied widely from part to part of the die, as a result, no honeycomb structure was produced. And the resistance pressure at the time of extrusion-forming was increased compared with that of the die of example 4.

In the die of example 5 having been subjected to chemical vapor deposition (CVD) at an atmospheric temperature of 330° C., its surface was a little less lustrous compared with example 3. And the observation of the surface under an electron microscope revealed that the whole surface was made up of particles 1 μm or less in diameter and 0.5 μm in average diameter and the particles of each particle diameter had a little non-uniform distribution. When analyzing the material of its surface layer using X-ray diffraction, though the spectra obtained were mostly those of $W_3C$, there were mixed peaks of W component spectra at a high rate compared with that of the die of example 3. And when using the die in extrusion-forming of the ceramic puddle containing a cordierite raw material as a main ingredient, though a honeycomb structure with partition walls of 100 μm thick was obtained without causing poor forming, the resistance pressure at the time of extrusion-forming was a little increased compared with that of the die of example 3.

In the die of comparative example 4 having been subjected to chemical vapor deposition (CVD) at an atmospheric temperature of 300° C., its surface was a considerably poor in luster. And the observation of the surface and the cross section of the die under an electron microscope revealed that the surface was made up of particles 3 μm or less in diameter and 2 μm in average diameter and part of the surface layer peeled off the substrate layer. When analyzing the material of its surface layer using X-ray diffraction, the spectra obtained were mostly those of W. And when using the die in extrusion-forming of the ceramic puddle containing a cordierite raw material as a main ingredient so as to produce a honeycomb structure, the surface layer of the die peeled off in a short period of time. The results are summarized in Table 2.

TABLE 2

| | Atmospheric Temperature (° C.) | Material of Surface layer | Surface Roughness of Die Surface | Resistance Pressure | Formability | Peeling Properties | Average Particle Diameter (μm) | Maximum Particle Diameter (μm) |
|---|---|---|---|---|---|---|---|---|
| Comparative Example 3 | 450 | $W_2C$ mixed at a high rate | high, non-uniform | large | poor | not peeled | 4.0 | 10 |
| Example 4 | 400 | $W_2C$ mixed at a somewhat high rate | a little high, a little non-uniform | a little large | a little poor | not peeled | 2.0 | 5.0 |
| Example 3 | 350 | $W_3C$ present at a high rate | low, uniform | small | satisfactory | not peeled | 0.1 | 0.5 |
| Example 5 | 330 | W mixed at a low rate | a little high, a little non-uniform | a little large | satisfactory | not peeled | 0.5 | 1.0 |
| Comparative Example 4 | 300 | W mixed at a high rate (thickness is non-uniform) | a little high, uniform | — | — | peeled | 2.0 | 3.0 |

*Table 2 shows the results obtained when setting the atmospheric pressure for 10 Torr and the final slit width for 100 μm.

COMPARATIVE EXAMPLE 5, EXAMPLE 6

Dies were obtained in the same manner as in example 1 except that the disks with a substrate layer formed on their surfaces were allowed to stand still in reaction chambers at atmospheric pressures of 50 Torr and 30 Torr and an atmospheric temperature of 350° C., respectively, so that they were subjected to chemical vapor deposition (CVD).

The dies thus obtained were such that the width of their slits was about 70 µm and the corner portions formed on the intersections of their slits in a grid arrangement were of R shape with a radius of curvature of about 35 µm.
(Evaluation)

In the die of example 6 having been subjected to chemical vapor deposition (CVD) at an atmospheric pressure of 30 Torr, its surface was partially less lustrous than that of example 1. And the observation under an electron microscope revealed that the whole surface was made up of particles 5 µm or less in diameter and 2 µm in average diameter and particles of large diameter (about 5 µm in diameter) were locally unevenly distributed. When analyzing the material of its surface layer using X-ray diffraction, though the spectra obtained were mostly those of $W_3C$, there were mixed spectra of $W_2C$ at a high rate compared with that of the die of example 1. When using the die in extrusion-forming of the ceramic puddle containing a cordierite raw material as a main ingredient, though a honeycomb structure with partition walls of 70 µm thick was obtained without causing poor forming, the resistance pressure at the time of extrusion-forming was a little increased compared with that of the die of example 1.

In the die of comparative example 5 having been subjected to chemical vapor deposition (CVD) at an atmospheric pressure of 50 Torr, there locally occurred lusterless portions on its surface. And the observation under an electron microscope revealed that the surface was made up of particles 2 to 10 µm in diameter (4 µm in average diameter) and particles of large diameter (about 10 µm in diameter) were locally unevenly distributed on the lusterless portions. When analyzing the material of its surface layer using X-ray diffraction, it was found that $W_2C$ particles were mixed at a high rate at the lusterless portions. When using the die in extrusion-forming of the ceramic puddle containing a cordierite raw material as a main ingredient, the extrusion-forming speed varied widely from part to part of the die, as a result, no honeycomb structure was produced. And the resistance pressure at the time of extrusion-forming was increased compared with that of the die of example 6. The results are summarized in Table 3.

COMPARATIVE EXAMPLE 6, EXAMPLE 7

Dies were obtained in the same manner as in example 3 except that the disks with a substrate layer formed on their surfaces were allowed to stand still in reaction chambers at atmospheric pressures of 50 Torr and 30 Torr and an atmospheric temperature of 350° C., respectively, so that they were subjected to chemical vapor deposition (CVD).

The dies for use in forming of honeycomb structures thus obtained were such that the width of their slits was about 100 µm and the corner portions formed on the intersections of their slits in a grid arrangement were of R shape with a radius of curvature of about 25 µm.
(Evaluation)

The results obtained from comparative example 6 and example 7 had basically the same tendency as those of examples 1, 6 and comparative example 5 where the final slit width was set for 70 µm; however, in the die of comparative example 6 and example 7, it was observed that the suitable atmospheric pressure range of chemical vapor deposition (CVD) was shifted toward the higher pressure range because their final slit width was set for 100 µm. In the following the evaluation results will be described for each example and comparative example.

In the die of example 7 having been subjected to chemical vapor deposition (CVD) at an atmospheric pressure of 30 Torr, the satisfactory results almost the same as those of example 3 were obtained.

In contrast with this, in the die of comparative example 6 having been subjected to chemical vapor deposition (CVD) at an atmospheric pressure of 50 Torr, there locally occurred lusterless portions on its surface. And the observation under an electron microscope revealed that the surface was made up of particles 2 to 8 µm in diameter (3 µm in average diameter) and particles of large diameter (about 10 µm in diameter) were locally unevenly distributed on the lusterless portions. When analyzing the material of its surface layer using X-ray diffraction, it was found that $W_2C$ particles were mixed at a high rate at the lusterless portions. When using the die in extrusion-forming of the ceramic puddle containing a cordierite raw material as a main ingredient, the extrusion-forming speed varied widely from part to part of the die, as a result, no honeycomb structure was produced. And the resistance pressure at the time of extrusion-forming was increased compared with that of the die of example 7. The results are summarized in Table 4.

TABLE 3

|  | Atmospheric Pressure (Torr) | Material of Surface layer | Surface Roughness of Die Surface | Resistance Pressure | Formability | Average Particle Diameter (µm) | Maximum Particle Diameter (µm) |
|---|---|---|---|---|---|---|---|
| Comparative Example 5 | 50 | $W_2C$ locally mixed at a high rate | high, non-uniform | large | poor | 4 (locally unevenly distributed) | 10 |
| Example 6, | 30 | $W_2C$ locally mixed at a low rate | a little high, a little non-uniform | a little large | a little poor | 2 (locally unevenly distributed) | 5 |
| Example 1 | 10 | $W_3C$ present at a high rate | low, uniform | small | satisfactory | 0.1 | 0.5 |

*Table 3 shows the results obtained when setting the atmospheric temperature for 350° C. and the final slit width for 70 µm.

TABLE 4

| | Atmospheric Pressure (Torr) | Material of Surface layer | Surface Roughness of Die Surface | Resistance Pressure | Formability | Average Particle Diameter (μm) | Maximum Particle Diameter (μm) |
|---|---|---|---|---|---|---|---|
| Comparative Example 6 | 50 | $W_2C$ locally mixed at a high rate | high, non-uniform | large | Poor | 3.0 (locally unevenly distributed) | 8.0 |
| Example 7 | 30 | $W_3C$ present at a high rate | low, uniform | small | Satisfactory | 0.4 | 1.0 |
| Example 3 | 10 | $W_3C$ present at a high rate | low, uniform | small | Satisfactory | 0.1 | 0.5 |

*Table 4 shows the results obtained when setting the atmospheric temperature for 350° C. and the final slit width for 100 μm.

INDUSTRIAL APPLICATION

As described so far, according to this invention, are provided a die for extrusion-forming a honeycomb structure which can restrain fluctuation in extrusion-forming speed among its parts and resistance to pushing force, both caused at the time of extrusion-forming, to be very small and is superior in abrasion resistance of its surface, and therefore, is suitable for forming of honeycomb structures with partition walls as thin as 70 μm or less and a manufacturing method thereof.

The invention claimed is:

1. A die for extrusion-forming a honeycomb structure, comprising:
a die base provided with ceramic puddle introducing holes and slits in communication with the ceramic puddle introducing holes,
a substrate layer, which roughly defines a final width of the slits, and
a surface layer, which precisely defines a final width of the slits, formed on the die base in this order so that the final width of the slits becomes 15 to 200 μm,
wherein the surface layer is made up of tungsten carbide particles and contains $W_3C$ as a main ingredient, and
the average particle diameter of $W_3C$ particles in the surface layer is 0.5 μm or less and the maximum particle diameter of $W_3C$ particles in the surface layer is 1.0 μm or less.

2. The die for extrusion-forming a honeycomb structure according to claim 1, wherein the substrate layer of 10 to 100 μm thick and the surface layer of 1 to 30 μm thick are formed on the die base in this order.

3. The die for extrusion-forming a honeycomb structure according to claim 2, wherein the width of the slits is 15 to 70 μm.

* * * * *